(12) United States Patent
Wilson et al.

(10) Patent No.: US 9,589,627 B1
(45) Date of Patent: Mar. 7, 2017

(54) METHODS AND DEVICES FOR A DDR MEMORY DRIVER USING A VOLTAGE TRANSLATION CAPACITOR

(71) Applicant: Cadence Design Systems, Inc., San Jose, CA (US)

(72) Inventors: Thomas Evan Wilson, Laurel, MD (US); Eric Harris Naviasky, Ellicott City, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/169,508

(22) Filed: May 31, 2016

(51) Int. Cl.

| | | |
|---|---|---|
| G11C 7/00 | (2006.01) | |
| G11C 11/4074 | (2006.01) | |
| G11C 11/4076 | (2006.01) | |
| G11C 11/409 | (2006.01) | |
| H03K 19/003 | (2006.01) | |
| H03K 17/14 | (2006.01) | |

(52) U.S. Cl.
CPC ........ *G11C 11/4074* (2013.01); *G11C 11/409* (2013.01); *G11C 11/4076* (2013.01); *H03K 19/00315* (2013.01); *H03K 17/145* (2013.01)

(58) Field of Classification Search
CPC ..... G11C 16/30; G11C 7/1057; G11C 7/1069; H03K 17/687; H03K 19/00315; H03K 19/00361; H03K 17/0822; H03K 17/145; H03K 19/017509; H03K 19/018507; H03K 19/018571
USPC .... 365/189.11, 149, 104; 327/333, 108, 109
See application file for complete search history.

(56) References Cited

U.S. PATENT DOCUMENTS 8,456,904 B2 * 6/2013 Tran ...................... G11C 16/28
365/104

* cited by examiner

*Primary Examiner* — David Lam
(74) *Attorney, Agent, or Firm* — Schwegman Lundberg & Woessner, P.A.

(57) ABSTRACT

Embodiments relate to systems, methods and computer readable media to enable design and creation of memory driver circuitry using a voltage translation capacitor. One embodiment is high speed level translation memory driver apparatus comprising a plurality of field effect transistors (FETs), complementary metal oxide semiconductor (CMOS) logic gates to drive the FETs, and a voltage translation capacitor with a first terminal of the voltage translation capacitor connected to an output of a second CMOS logic gate and a second terminal of the voltage translation capacitor connected to a gate terminal of a first P-type FET. Additional embodiments including other circuitry, associated methods, and media comprising instructions associated with generation of circuit design files are also described.

20 Claims, 9 Drawing Sheets

METHODS AND DEVICES FOR A DDR MEMORY DRIVER USING A VOLTAGE TRANSLATION CAPACITOR

TECHNICAL FIELD

Embodiments described herein relate to electronic circuits and design automation (EDA), and to associated systems, methods, devices, and instructions for generation of circuit design files. Some embodiments pertain to microprocessor interface circuits with memory devices, for example double data rate (DDR) synchronous dynamic random access memory (SDRAM) such as DDR2, DDR3, DDR4 and low power double data rate (LPDDR) SDRAM used in portable electronic devices. Some embodiments particularly relate to driving these memory devices from microprocessors with a low core voltage.

BACKGROUND

A typical computing machine is implemented with a microprocessor, memory and a number of other modules depending on the function to be performed by the computing machine. Double data rate (DDR) random access memory (RAM) is a particular type of RAM commonly used in current technology that performs two read accesses or two write accesses per clock cycle. Both microprocessors and DDR RAM operate on various different power supply voltages. Driver interface circuits can be used to allow for compatible communication between different microprocessors and DDR RAM chips.

Electronic design automation (EDA) is a category of systems for assisting with the design of electronic systems and devices. Large, integrated circuit designs are often assembled from previously designed blocks. This enables reduced turnaround times for generation of an integrated circuit. Schematic and layout information for such block portions of a design may be exchanged or licensed as intellectual property.

DETAILED DESCRIPTION

Embodiments described herein relate to microprocessor interface circuits with memory devices, particularly memory devices such as double data rate (DDR) synchronous dynamic random access memory (SDRAM) such as DDR2, DDR3, DDR4 and low power double data rate (LPDDR) SDRAM used in portable electronic devices. Some embodiments particularly relate to driving these memory devices from microprocessors with a low core voltage. The following description and the drawings illustrate specific embodiments to enable those skilled in the art to practice them. Other embodiments can incorporate structural, logical, electrical, process, and other changes. Portions and features of some embodiments can be included in, or substituted for, those of other embodiments, and are intended to cover all available equivalents of the elements described.

Some embodiments described herein relate to circuits designed in complementary metal oxide semiconductor field effect transistors (CMOS). These transistors are used in some digital integrated circuits for their simplicity, low cost, high density and also for their low power dissipation. Specifically, CMOS transistors only dissipate power while dynamically switching and exhibit no static power dissipation. The CMOS transistors are either of an N-type or a P-type which indicates the doping content of the channel of the transistor. For example, an N-channel CMOS transistor produces an N-channel when the gate voltage exceeds a threshold. The N-type or N-channel transistors will be referred to as N-channel metal oxide semiconductor (NMOS) field effect transistors (FET) and the P-type or P-channel transistors will be referred to as P-channel metal oxide semiconductor (PMOS) FETs. Common voltages used to describe these transistors are the gate to source voltage ($V_{gs}$), drain to source voltage ($V_{ds}$) and threshold voltage ($V_t$). The current through the transistors is the drain to source current ($I_{ds}$). For NMOS transistors, all these values, in some embodiments, are positive and for PMOS transistors, in some embodiments, all these values are negative. In various embodiments described herein, the PMOS voltages and current will be described in terms of absolute values. Specifically, when referring to PMOS transistors, the gate to source voltage will mean $|V_{gs}|$, the drain to source voltage will mean $|V_{ds}|$, the threshold voltage will mean $|V_t|$ and the drain current will mean $|I_{ds}|$. Anywhere herein where particular values are used, including specific values (e.g. 0 volts, 0.7 volts, etc.) it is to be understood that this is referring to a target value which operates within a variation tolerance around or approximate to the described value, where the variation is within tolerances set by the specific implementation (e.g. +/−0.05 volts, etc.)

Figure 1:
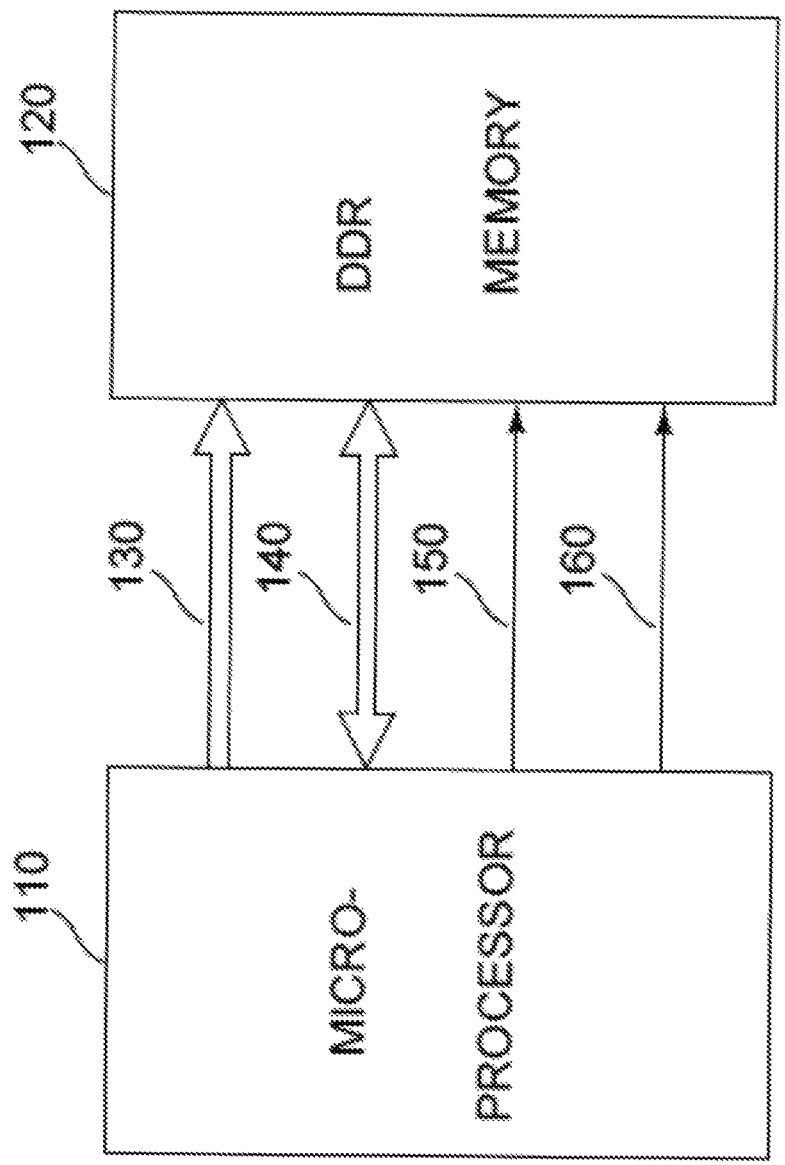
FIG. 1 illustrates the interface between a microprocessor and a memory module, in accordance with some embodiments described herein.

FIG. 1 illustrates the interface between microprocessor 110 and a memory module 120, in accordance with some embodiments described herein. The memory module 120 is a dynamic random access memory (DRAM) that is connected to the microprocessor 110 by an address bus 130, a data bus 140, and the control signals read-write (R/W) 150 and chip-enable (CE) 160. The system shown in FIG. 1, is a generic simple implementation of a microprocessor system that would be modified in various ways depending on the application. The memory module 120 is a double data rate (DDR) synchronous dynamic random access memory (SDRAM).

Non-volatile memory is memory that retains the stored information even when powered off. Examples of non-volatile memory are hard disks, memory tapes, and flash RAM. Volatile RAM is memory that loses the information when power is disconnected. Examples of volatile ram are static RAM (SRAM) and dynamic RAM (DRAM). SRAM uses more transistors in a feedback latch up configuration, which does not include refreshing operations. DRAM may be implemented with a small capacitor which will slowly leak charge and consequently needs to be periodically refreshed. SRAM is faster and more expensive and used sparingly in devices such as a high speed cache. DRAM is one method for the bulk volatile memory access. DRAM may be controlled on a system clock and therefore referred to as synchronous dynamic random access memory (SDRAM).

Single data rate (SDR) SDRAM was originally built to execute one memory read access or one write access per clock cycle. On each clock cycle an n-bit word may be transferred to or from the memory. The word length is, in some embodiments, configured in multiples of eight, and in more recent computer machines, it is common to transfer 64 bit words per clock cycle. Double data rate (DDR) SDRAM was implemented as an improvement over SDR SDRAM capable of performing two read accesses or two write accesses per clock cycle. This was accomplished by performing one access on the rising edge of the clock and one access on the falling edge of the clock. In this manner, the data transfer rate is doubled by transferring two 64 bit words per clock cycle.

The operation of the microprocessor 110 involves the execution of programs that are loaded into the memory module 120 so as to create, edit and delete data that is also stored in the memory module 120 or other devices. Specifically, each microprocessor operation involves a fetch and execute cycle where an instruction is read from the memory module 120, decoded by the microprocessor 110 and executed. Also, the execution of the instruction often involves a data read or a data write to the memory module 120. Each of these instruction cycles is performed synchronously to a system clock, with the duration of the instruction cycle lasting between one and three clock cycles.

The memory access interface traditionally involves bi-directional data bus 140 with a bus width of n bits to provide the transfer to and from the memory module 120 in the form of n-bit words. The location in the memory module 120 which the data word is being written to or read from is indicated by the address bus 130. The memory module 120 is selected by the CE signal which allows the data bus 140 to be used by other devices not shown in FIG. 1. The R/W 150, signal indicates to the memory module 120 whether the data access is a read operation or a write operation. This also determines the directional operation of the data bus 140. A clock signal is used to synchronize the microprocessor 110 and the memory module 120 during memory access and is not shown in FIG. 1.

During a write operation, the microprocessor 110 indicates the address location on the address bus 130 and places the data on the data bus 140. It also asserts the CE signal 160 and the R/W signal 150 for a write operation. Then the DDR SDRAM 120 writes the data on the data bus 140 into the memory at the address location indicated by the address bus 130 and the write operation is complete. During a read operation, the microprocessor 110 indicates the address location on the address bus 130 and floats the data bus 140 (high Z or high impedance state). It also asserts the CE signal 160 and the R/W signal 150 for a read operation. Then the DDR SDRAM 120 places the data at the memory location indicated by the address bus 130 onto the data bus 140. The microprocessor 110 then reads the data from the data bus 140 and the read operation is complete. All these functions are synchronized to the system clock which is provided to both the microprocessor 110 and the memory module 120. This a description of a microprocessor 110 with a very simple implementation. Many implementations are significantly more complicated involving memory caches, direct memory access transfers, and a plethora of other devices connected to the microprocessor system bus.

The frequency with which the microprocessors 110 access memory 120 impacts performance. Since every instruction cycle involves at least one memory access, the speed of a computer machine is greatly limited by the memory access speed. Therefore, improving the method and speed of the memory access plays a continuing role in the evolution of computer machines. There are several related factors. The interface circuits that are controlling the bus are configured to have sufficient drive capability to quickly switch under the loading conditions as presented by the bus lines and the chips connected to them. The signals propagate fast enough along the bus lines that transmission effects become significant. Therefore, the bus lines along with the source and load impedances are controlled so as to reduce reflections. Additionally, the memory module 120 and the microprocessor module 110 may operate at different power supply voltages. Therefore, memory access may involve the use of a level translator.

Memory types such as DDR3, DDR4, LPDDR3, and LPDDR4 typically operate between a $V_{ddq}$=1.6 Volt supply voltage down to a $V_{ddq}$=1.0 Volt supply voltage while current microprocessor cores operate with a power supply voltage as low as low as $V_{dd}$=0.65 Volts. Therefore, translator interface circuits are needed that can drive a memory module 120 operating on a higher supply voltage from a microprocessor 110 with a lower core voltage. And specifically, it is useful that the translator interface driver circuits are capable of driving different voltage levels so that the microprocessor 110 can be used with different types of memory 120 operating on different supply voltages. The microprocessor supply voltage, core supply voltage or signal supply voltage will be referred to as $V_{dd}$ while the memory supply voltage or input/output (I/O) supply voltage will be referred to as $V_{ddq}$.

Integrated circuit (IC) technologies offer different types of transistor devices depending on their intended application. Specifically, there are signal devices and input/output (I/O) devices. The microprocessor 110 uses signal devices operating on the lower microprocessor core supply voltage for computation and program execution. The microprocessor uses I/O devices that can withstand larger voltage levels and higher power levels to interface with external circuits and chips. The signal devices such as a signal metal oxide semiconductor field effect transistors (MOSFET) are built for low power consumption and switching speed. A MOSFET transistor is typically built with a metal or polysilicon gate material constructed over the channel of the transistor. When the voltage applied to the gate terminal exceeds a certain threshold (threshold voltage $V_t$), a conductive channel forms underneath the gate allowing current to flow from the source to the drain. A thin oxide layer separates and insulates the gate from the channel. The oxide layer is deliberately designed to be very thin to improve transistor characteristics such as the unity gain frequency and threshold voltage. If the gate to drain or gate to source voltage across the oxide layer exceeds a certain level, the transistor will be damaged. The larger I/O transistors are built with a greater power handling capability and with a thicker oxide layer. This allows the I/O transistor to operate with I/O voltage levels without causing damage to the transistor. In some embodiments, such signal transistors consume less power, occupy less chip area and switch faster.

Figure 2:
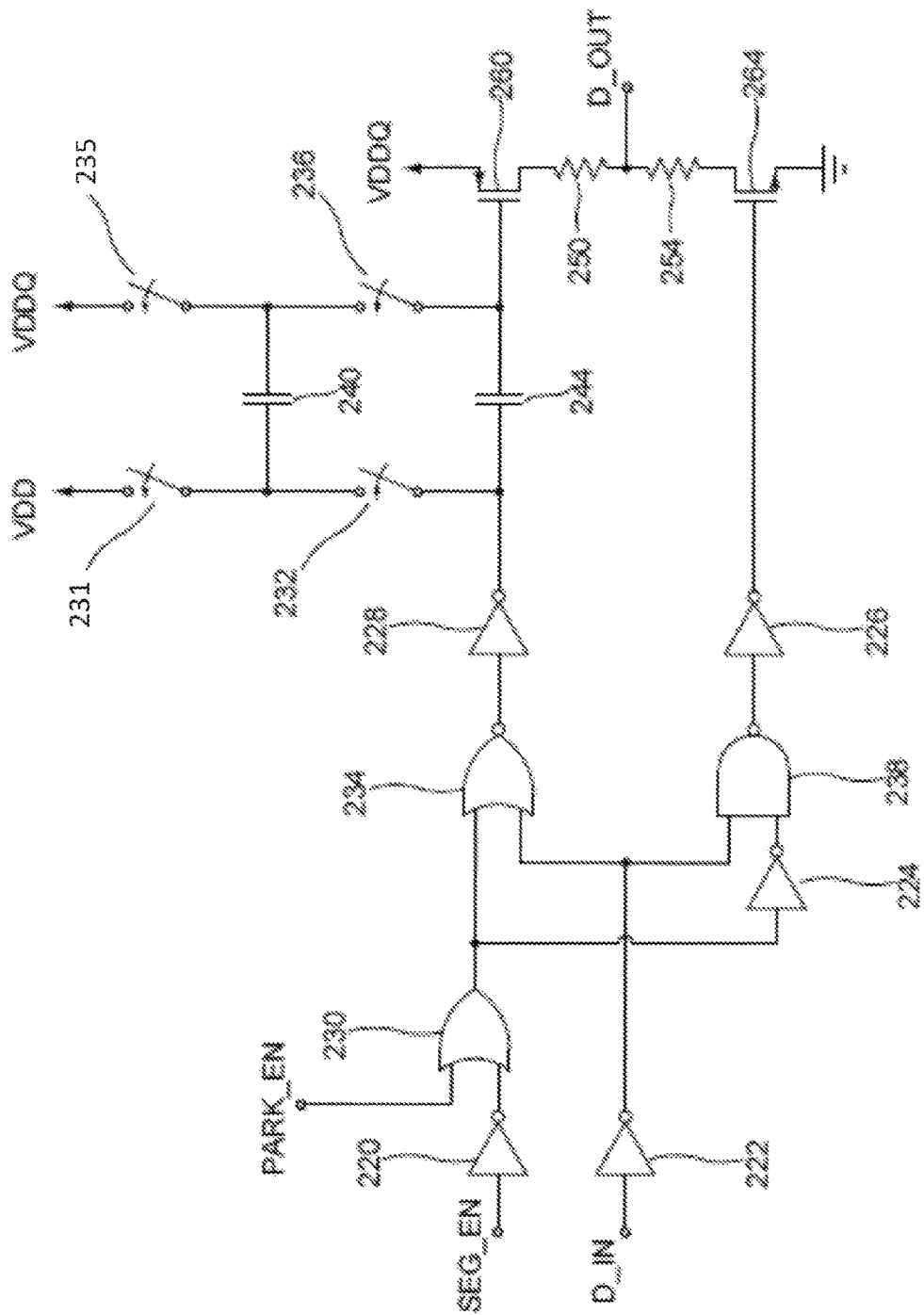
FIG. 2 illustrates a level shifter circuit and a driver circuit to drive DDR memory devices, in accordance with some embodiments.

FIG. 2 illustrates a level shifter circuit and a driver circuit to drive DDR memory devices in accordance with some embodiments. All the logic devices operate at the microprocessor core supply voltage $V_{dd}$ while the final driver stage operates from the I/O supply voltage $V_{ddq}$. Assume initially that the park enable input is low (PARK_EN=0) and the segment enable input is high (SEG_EN=1). Then the NOT gate 220 and the OR gate 230 have a low output. Therefore, the NOR gate 234 has one input fixed low and the NAND gate 238 has one input fixed high (the NOT gate 224 has a low input and a high output). The data input signal (D_IN) is inverted by the NOT gate 222 to provide a $\overline{D\_IN}$ which drives the other inputs of the NAND gate 238 and the NOR gate 234. Under these conditions, the NAND gate 238 in combination with the NOT gate 226 and the NOR gate 234 in combination with the NOT gate 228 will transparently pass $\overline{D\_IN}$ to the outputs of the NOT gates 228 and 226. While logically transparent, the NOT gates 226, 228 provide buffering to drive the I/O transistors 260 and 264. Assume that the voltage translation capacitor 244 is charged to a voltage of $V_{ddq}-V_{dd}$ and that it is large enough to maintain that voltage when switching the PMOS gate voltage along with its associated parasitic capacitances. The output stage is constructed with a PMOS transistor 260, an NMOS transistor 264, and resistors 250 and 254 to switch the output and control the source impedance of the driver. The source of the PMOS transistor 260 is connected to the memory or I/O supply voltage $V_{ddq}$ allowing the PMOS transistor 260 to pull the output up all the way up to $V_{ddq}$. The PMOS and NMOS transistors 260 and 264 are I/O devices capable of withstanding higher supply voltages, drive voltages and output currents.

Assume that the core supply voltage is $V_{dd}$=0.7 Volts and the DDR memory supply voltage (or I/O supply voltage) is $V_{ddq}$=1.5 Volts. When D_IN is low (0 volts) the output of NOT gates 226 and 228 is high at $V_{dd}$=0.7 Volts (This is because the NOT gates 226 and 228 are running on the core voltage supply $V_{dd}$). Since the voltage translation capacitor 244 is charged to $V_{ddq}-V_{dd}$, the gate voltage of PMOS 260 is roughly equal to $V_{ddq}$. Therefore, the gate to source voltage of the PMOS FET 260 is 0 Volts and PMOS FET 260 will turn off. NMOS FET 264 has a gate to source voltage of $V_{dd}$=0.7 Volts. Assuming this is greater than the threshold voltage, NMOS 264 will turn on and pull D_OUT to 0 Volts. Then when D_IN switches high to $V_{dd}$=0.7 Volts and the output of NOT gates 226 and 228 will be low at 0 Volts. Therefore, the gate voltage of PMOS 260 will be equal to the voltage across the voltage translation capacitor 244 ($V_{ddq}-V_{dd}$=0.8 Volts). The magnitude of the gate to source voltage of PMOS 260 is then $V_{dd}$=0.7 Volts. If this is greater than the magnitude of the threshold voltage, $|V_t|$, of the PMOS FET 260, then PMOS FET 260 will turn on and pull D_OUT up to $V_{ddq}$. In both cases, the gate to source voltage produced across either the PMOS transistor 260 or the NMOS transistor 264 when the transistors are turned on is $V_{dd}$ regardless of $V_{ddq}$. Therefore, as long as the core supply voltage $V_{dd}$ exceeds the threshold voltage ($V_t$) of the I/O devices, the I/O devices will successfully switch the output.

The voltage translation capacitor 244 enables the logic devices running on the core supply to drive the gate of the PMOS transistor 260 well above the core voltage. The voltage translation capacitor 244 maintains the voltage difference between the microprocessor core voltage and the DRR memory voltage while switching. First, to maintain the voltage difference while switching, the voltage translation capacitor 244 should be chosen with significantly larger capacitance than the gate to source capacitance ($C_{gs}$) and the gate to drain capacitance ($C_{gd}$) of PMOS FET 260. During switching, a portion of the charge on the voltage translation capacitors 244 is transferred or pumped onto the gate of PMOS FET 260. Ensuring that the voltage translation capacitor 244 is comparatively large, the voltage variation of the voltage translation capacitor 244 due to this charge transfer will be negligible. Second, the voltage translation capacitor 244 should be charged and periodically refreshed to replenish any charge leakage during operation. The switched capacitor 240 along with reload switches 231 and 232 and charge switches 235 and 236 are implemented to perform this charge replenishment or refresh function. During a reload cycle, the reload switches 231 and 235 are closed while the charge switches 232 and 236 are open. This charges the switched capacitor 240 to $V_{ddq}-V_{dd}$. Then, during a charge cycle, the reload switches 231 and 235 are opened and the charge switches 232 and 236 are closed. At this point, any charge leakage from the voltage translation capacitor 244 is replenished by the switched capacitor 240. The reload and charge cycle or refresh cycle occurs frequently enough to negate the rate of charge leakage. This determines the reload/charge cycle time and the size of the switched capacitor 240. If the reload switches 231, 235 and the charge switches 232, 236 are closed at the same time the output of inverter 228 would be shorted to $V_{dd}$ and the gate of PMOS 260 would be shorted to $V_{ddq}$. Therefore, while the output of the driver circuit is being used to transmit data, the reload switches 231 and 235 and the charge switches 232 and 236 cannot be simultaneously closed. Therefore, the reload switches 231, 235 and the charge switches 232, 236 are controlled with non-overlapping clocks. To this end, the memory driver circuit can seamlessly operate with the charge refresh continuously operating in the background.

The charge switches 232, 236 and the reload switches 231, 235 may be implemented with transmission gates or possibly with PMOS transistors. Since they are connected to the memory voltage supply, they are implemented using I/O transistors to sustain the higher supply voltage levels at which they are operated. The switches can be implemented with CMOS transmission gates or possibly with individual PMOS transistors.

The memory driver circuit illustrated in FIG. 2 can be implemented with parallel segments to form an array of memory driver segments that drive a single line. By activating or deactivating one or more of the segments, the source impedance and drive strength can be controlled. Also, since the driver circuits may be used on a bidirectional bus, the entire array is deactivated into a high impedance state when the I/O line is used for receiving. The segment enable control signal switches the segment between active drive and the high impedance state. The active drive mode was described above with the segment enabled (SEG_EN=1). When the segment is disabled, (SEG_EN=0), the OR gate 230 output is high. This forces the output of inverter 228 high to $V_{dd}$=0.7 Volts and the output of inverter 226 to 0 Volts. With capacitor 244 charged to $V_{ddq}-V_{dd}$, the gate voltage of PMOS 260 will be at $V_{ddq}$ and the gate voltage of NMOS 264 will be at 0 Volts. Therefore, both I/O output transistors will be off, leaving the I/O output in a high impedance state.

The last mode to be discussed is the park mode. When the I/O memory driver is not being used for some time, the circuit can be "parked" with both of the reload switches 231, 235 and both of the charge switches 232, 236 closed. This will short the voltage translation capacitor 244 to the core supply voltage and the I/O supply voltage. In this mode, the charge on the voltage translation capacitor 244 is set and maintained without the non-overlapping clocks running. The park control signal is set high in this mode forcing the segment into the high impedance mode, not only because the driver is inoperable in this state, but also because the output of NOT gate 228 is high. In the "parked" mode, if the output of NOT gate 228 was driven low, then a shorting condition would exist from the core supply $V_{dd}$, through the closed switches and through the NOT gate 228 to ground. The park enable control is operated through the OR gate 230 with the segment enable control and prevents this shorting condition from occurring. The park mode is useful for power up to quickly charge the voltage translation capacitor 244 and to leave the driver circuit ready to immediately operate after being "awakened" from a period of inactivity.

Figure 3:
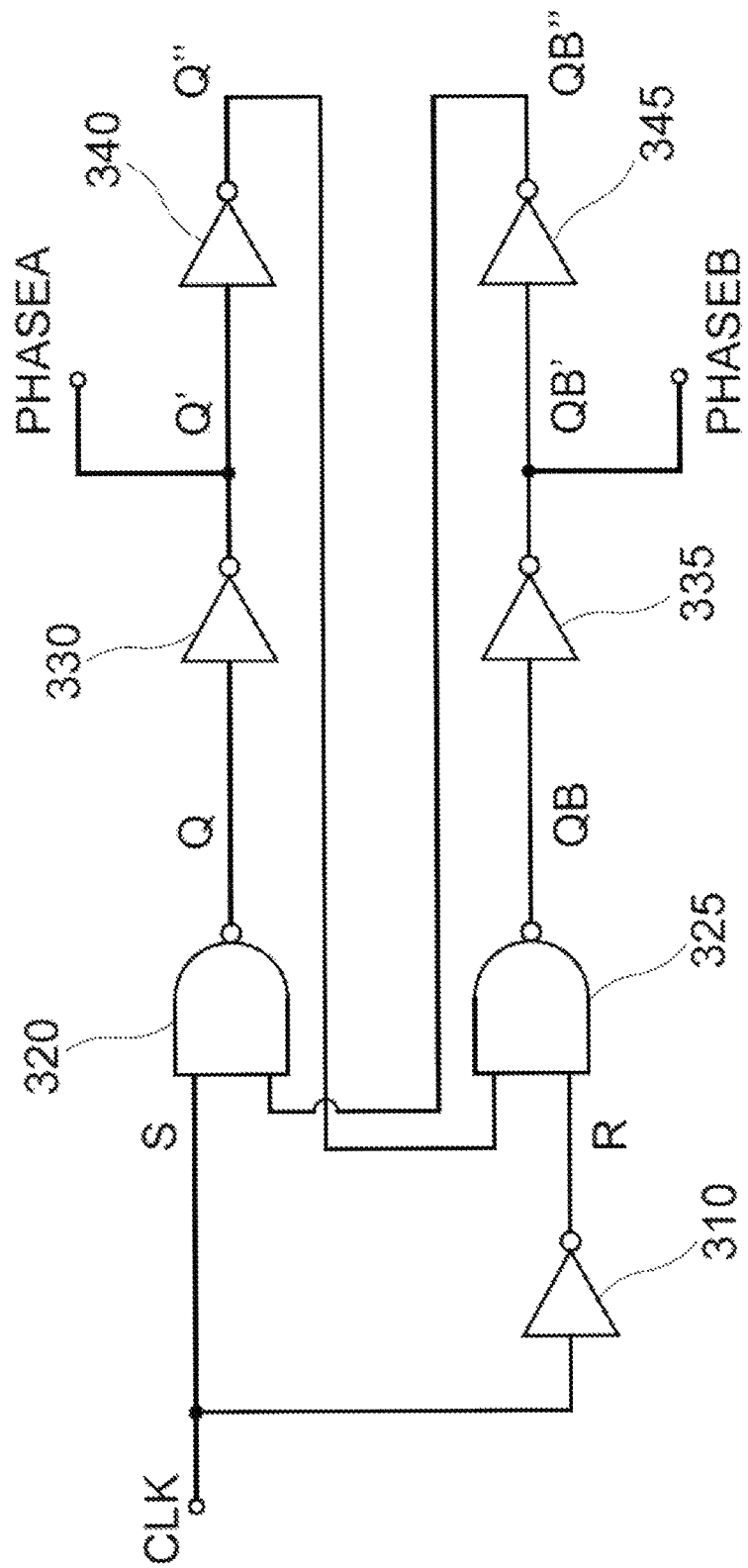
FIG. 3 illustrates a non-overlapping clock generator, in accordance with some embodiments.

FIG. 3 illustrates a non-overlapping clock generator in accordance with some embodiments. The circuit is comprised of an SR latch made up with NAND gates 320 and 325. A NAND SR latch has active low set and reset inputs operating by the table shown below.

TABLE 1

| set | reset | Q    |
|-----|-------|------|
| 1   | 1     | hold |
| 0   | 1     | 1    |
| 1   | 0     | 0    |
| 0   | 0     | N/A  |

The inverters 330, 335, 340 and 345 do not alter the logical feedback signals to the SR latch inputs as they are each twice inverted. However, they do introduce delay which helps to ensure non-overlapping clocks. The non-overlapping clocks are taken from the outputs of inverters 330 and 335. Inverter 310 simply switches the clock signal so that the SR latch is always either being set or reset. Note that every time the set NAND gate 320 transitions, there is ripple effect through inverters 330 and 340 with each output switching one propagation delay after its predecessor (Q→Q'→Q"). And every time the reset NAND gate 325 transitions, there is another ripple effect through inverters 335 and 345 with each output switching one propagation delay after its predecessor (QB→QB'→QB"). Phase A of the non-overlapping clock is taken from Q' and phase B of the non-overlapping clock is taken from QB'.

Figure 4:
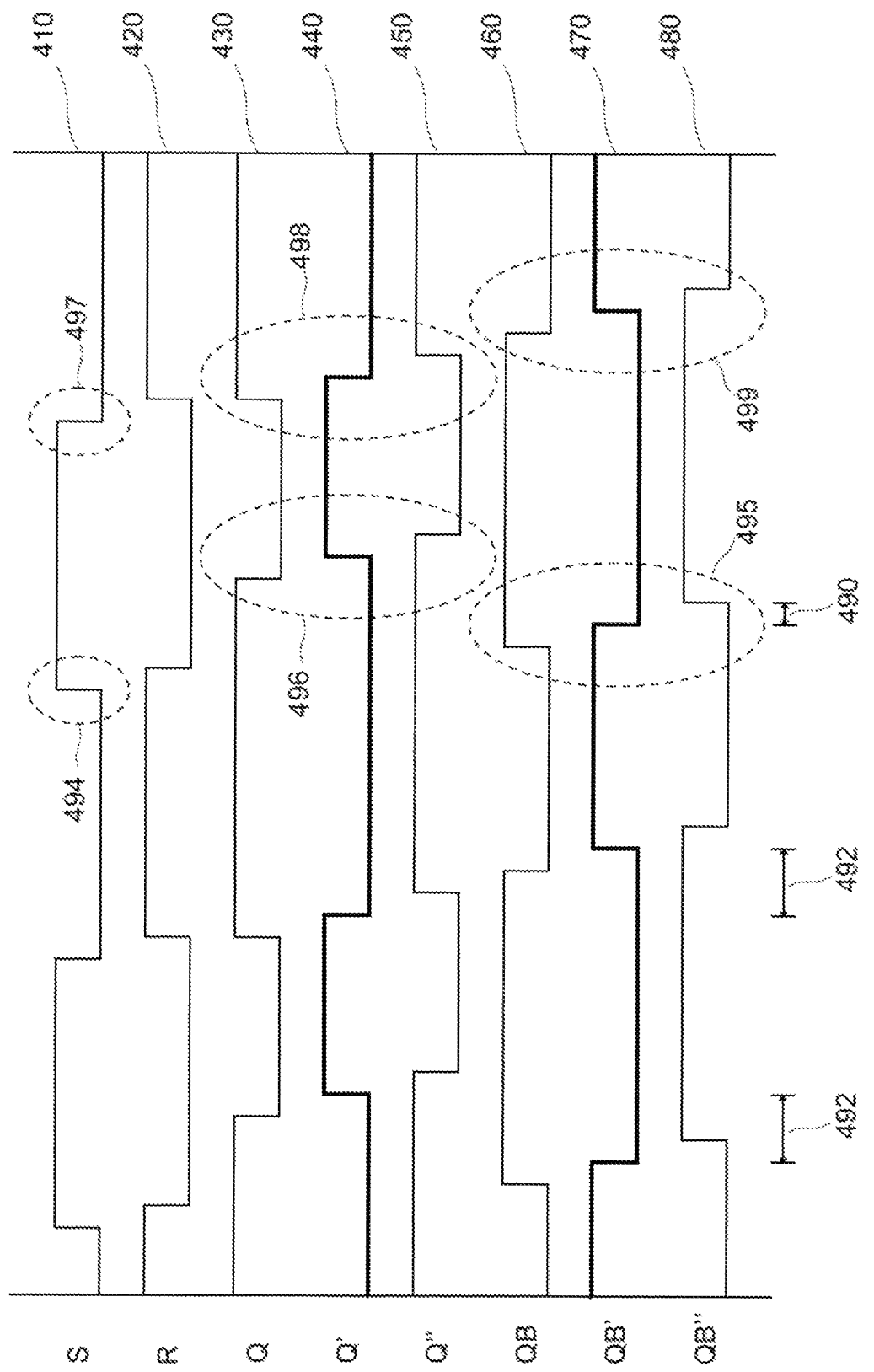
FIG. 4 is a timing diagram of the non-overlapping clock generator in accordance with some embodiments.

FIG. 4 is a timing diagram of the non-overlapping clock generator shown in FIG. 3, in accordance with some embodiments. A generic propagation delay (td) of a gate is indicated by 490. Assume that the clock input Which is the same as the set (S) input signal 410 to the NAND SR latch is low. Therefore, the reset (R) 420 is high and the SR latch has been set. So initially, Q 430 is high, Q' 440 is low, Q" 450 is high, QB 460 is low, QB' 470 is high, and QB" 480 is low. Then the clock and the set input 410 switches high. The NAND gate 320 does not initially switch low because QB" 480 is still low (zero ANDed with anything is zero, and inverted is one). The reset (R) input 420 switches low after one td and the reset process begins. The reset NAND gate 325 transitions high starting the reset ripple (QB→QB'→QB"). Specifically, QB 460 switches high after one td, QB' 470 switches low after two td and QB" 480 switches high after three td. At this point QB" 480 and the S input 410 to the set NAND gate 320 are both high. Therefore, the set NAND gate transitions low starting the set ripple (Q→Q'→Q"). Specifically, Q 430 switches low after one td, Q' 440 switches high after two td and Q" 450 switches low after 3 td. QB' 470 switches low before Q' 440 switches high. Specifically, there are three propagation delays 492 from when QB' 470 switches low to when Q' 440 switches high (where Q' 440 is phaseA and QB' 470 is phaseB). This propagation delay prevents phaseA and phaseB from being simultaneously asserted. After approximately half a clock period, the set input 410 returns back to low. R 420 switches high after one td. The reset NAND gate 325 does not initially switch as Q" 450 is still low. However, the set NAND gate 320 transitions high, starting the set ripple (Q→Q'→Q"). Specifically, Q 430 switches high after one td, Q' 440 switches low after two td and Q" 450 switches high after 3 td. At this point, Q" 450 and the reset input (R) 410 to the reset NAND gate 320 are both high. Therefore, the reset NAND gate 320 transitions low, starting the reset ripple (QB→QB'→QB"). Specifically, QB 460 switches low after one td, QB' 470 switches high after two td and QB" 480 switches low after three td. Q' 440 switches low three propagation delays 492 before QB' 470 switches high (where Q' 440 is phaseA and QB' 470 is phaseB). This cycle continues, preventing the phaseA clock and the phaseB clock from ever being asserted simultaneously.

The key to the non-overlapping clock generator is illustrated with the transitional groupings 494, 495 and 496. In this transitional grouping, the clock signal transitions high at 494, the reset outputs (QB, QB', and QB") transition second in 495, and the set outputs (Q, Q', and Q") transition last in 496. This is because the set NAND gate 320 does not transition until after the reset ripple (until after QB" switches high). When the clock signal transitions low at 497, the set outputs (Q, Q', and Q") transition second in 498 and the reset outputs (QB, QB', and QB") transition last in 499. This is because the reset NAND gate 325 does not transition until after the set ripple (until after Q" switches high). This ordering of the reset outputs transitioning first when the clock transitions high versus the set outputs transitioning first when the clock transitions low is what creates the non-overlapping clock signals. In this manner, within transition groups 495 and 496, QB' switches low before Q' switches high. And within transition groups 498 and 499, Q' switches low before QB' switches high.

Figure 5:
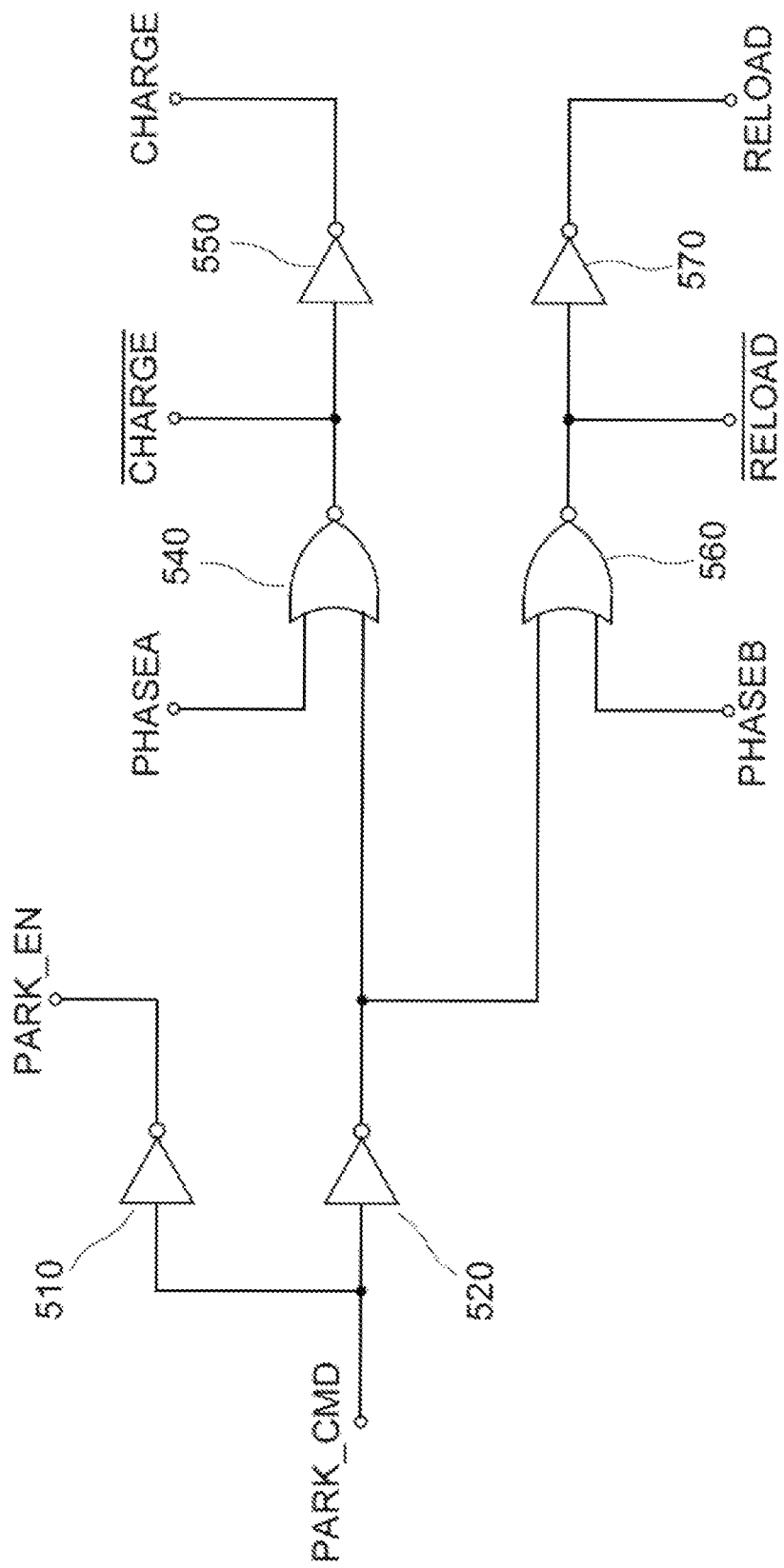
FIG. 5 illustrates a "park" control circuit, in accordance with some embodiments.

FIG. 5 illustrates a "park" control circuit, in accordance with some embodiments. The PARK_CMD is active low and buffered and inverted with NOT gates 510 and 520. With the PARK_CMD high, the output of NOT gate 520 is low causing the NOR gates 540 and 560 to pass the PHASEA and PHASEB clock signals with inversion. Thus, the outputs of the NOR gates 540 and 560 provide an active low non-overlapping clock signals (CHARGE and RELOAD). The outputs of inverters 550 and 570 provide the active high non-overlapping clock signals (CHARGE and RELOAD). When the PARK_CMD signal is set low for "park" mode, the output of the NOT gate 520 is high. This way, the output of the NOR gates 540 and 560 are always low and the output of the inverters 550 and 570 are always high. This asserts the CHARGE and RELOAD signals and closes all the switches shorting the switching cap and the voltage translation cap to the supplies as previously discussed with FIG. 2. The NOT gate 510 provides the proper sense for the park command signal (active high) to the circuit in FIG. 2. Since the switches in FIG. 2 operate with the I/O power supply voltage, they may need I/O voltage level control signaling. Therefore, the circuit shown in FIG. 5 may involve level translation for the charge and reload control signals.

Figure 6:
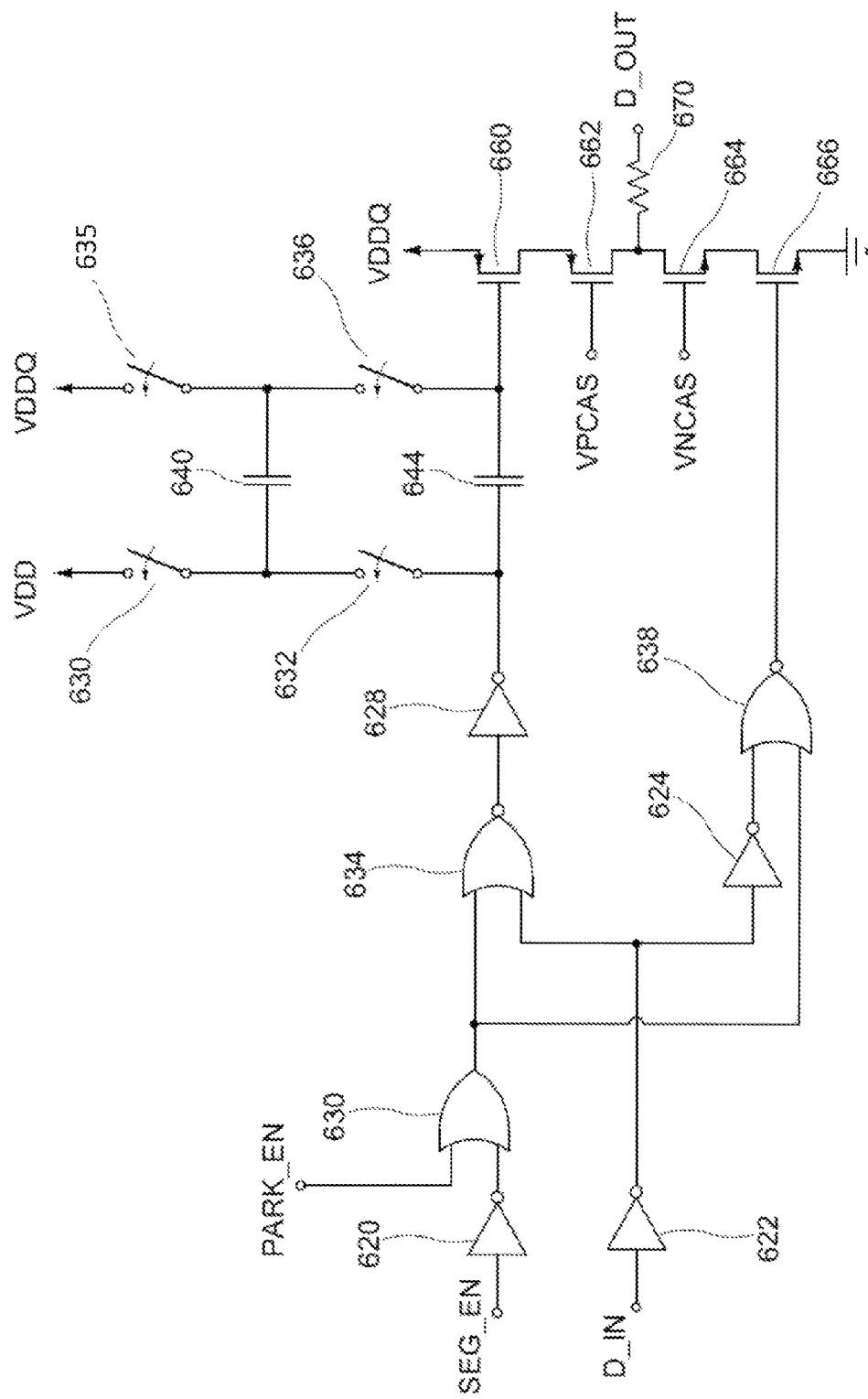
FIG. 6 illustrates another level shifter circuit and a driver circuit to drive DDR memory devices, in accordance with sonic embodiments.

FIG. 6 illustrates another level shifter circuit and a driver circuit to drive DDR memory devices, in accordance with some embodiments. The driver circuit differs from that shown in FIG. 2 in two ways. First the I/O output stage is comprised of additional transistors, PMOS 662 and NMOS 664 along with resistor 670. By setting VPCAS to an appropriate gate voltage, PMOS 662 can shield the drain voltage of PMOS 660 from the full output swing. This allows for the possibility of implementing PMOS 660 with a signal device as opposed to an I/O device. The same observation applies for NMOS 666 and NMOS 664. By implementing PMOS 660 and NMOS 666 with signal transistors (or core voltage transistors), the size and capacitive loads presented to the previous stages (inverter 628 and NOR gate 638) are smaller for an equivalent trans-conductance. This allows for less power consumption and faster switching. Further, since the gate to source capacitance of PMOS 660 is smaller, the voltage translation capacitor 644 can be smaller and still maintain the level translation voltage while switching.

The other difference in this embodiment shown in FIG. 6 is the logic gate combination comprised of the inverter 624 and the NOR gate 638. This is logically equivalent to the NAND gate 238 and inverters 224 and 226 as seen by De Morgan's theorem. Specifically, when the segment is active and not in "park" mode, the inverter 620 and the OR gate 630 provide an output low to the NOR gates 634 and 638, causing them to behave transparently (with inversion). Since both signal paths are comprised of inverters 624 and 628, the outputs of inverter 628 and the NOR gate 638 move together. This logical construction may be superior to that shown in FIG. 2 because both the PMOS and the NMOS driver paths contain the same elements (one inverter and one NOR gate) improving the match; particularly, the match in propagation delay and switching characteristics. The voltage translation capacitor 644 behaves like a battery, maintaining a constant voltage as described with FIG. 2 and allowing the inverter 628, built on the core supply voltage, to turn PMOS 660 on and off. The charge switches 632 and 636 along with the reload switches 630 and 635 are used to replenish the charge on the voltage translation capacitor 644 using the switched capacitor 640 as was described with FIG. 2.

There are numerous ways to implement the signal logic comprised of the NOR gates 634 and 638, the inverters 620, 622, 624 and 628 and the OR gate 630. Functionally, however, the signal logic provides a PMOS drive output and an NMOS drive output that switch together in the same direction when driving output data, but that switch in opposite directions when setting high impedance mode. Specifically, for high impedance mode, the PMOS drive from the output of inverter 628 switches to the positive rail while the NMOS drive from the output of the NOR gate 638 switches to the negative rail. This turns off the output stage transistors and provides a high impedance output, which allows the bus lines to be used for receiving.

Previously, voltage level translation has been performed by a differential NMOS circuit driving a PMOS load with cross coupled gates. This is followed by SR latches for duty cycle conditioning and a number of buffer stages to drive the final I/O stage. Such circuit elements were run at I/O supply voltage levels using I/O devices. In the proposed embodiments, the pre-drive circuits are not run at I/O voltage levels. In various embodiments, the entire process implemented by differentially level shifting, duty cycle conditioning and re-buffering is circumvented by the use of a voltage translation capacitor 644. This allows for the use of signal transistors that operate on the core supply voltage all the way up to the PMOS/NMOS driver stage. Since the signal transistors have shorter channels and thinner gate oxide, the trans-conductance to gate capacitance ratio ($f_t$) is substantially better. This allows for faster switching with smaller devices consuming less power. In some embodiments, the power and chip area are greatly reduced by the fact that the proposed embodiments do not use a differential level translator circuit, a duty cycle conditioning circuit and numerous buffer stages, all of which were previously implemented with I/O devices. Also, without the single ended to differential conversion, the differential level translation, the duty cycle conditioning, and additional buffering, there is less jitter and skew between data signals that would otherwise result from mismatched devices and power supply noise. And finally, since the drivers consume less power, less power supply decoupling capacitance is needed which results in additional savings in terms of chip area.

The example embodiment is estimated to consume approximately 24% less power from the I/O supply while switching twice as fast. Other embodiments may provide similar benefits. In some embodiments, the latency from data input to output driver is reduced from approximately 500 ps to less than 150 ps, the jitter is improved by 40% and the chip area is reduced by 30%.

Figure 7:
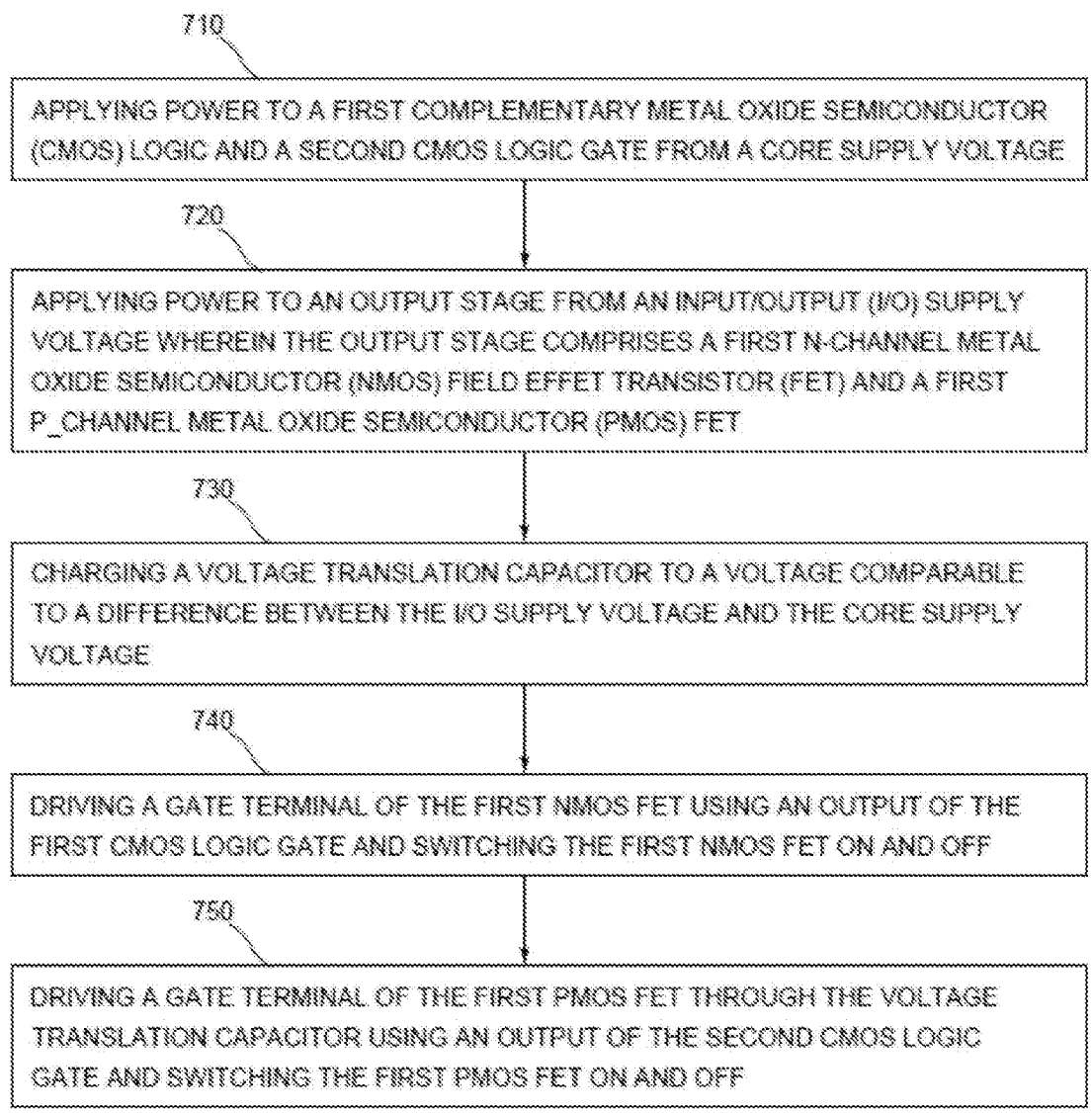
FIG. 7 illustrates an example operational flow of a level translator driver apparatus, in accordance with some embodiments.

FIG. 7 illustrates an example operational flow of a level translator driver apparatus in accordance with some embodiments. In operation 710, power is applied to the CMOS logic gates that are operating from a core supply voltage of the microprocessor 110. The CMOS logic gates are used to generate the logic signals and are scaled to provide output currents that are sufficient to drive the PMOS FET and the NMOS FET in the output stage. In operation 720, power is applied from an I/O supply voltage to CMOS output stage comprised of a PMOS FET and an NMOS FET. The PMOS FET and the NMOS FET are stacked with the source of the NMOS connected to ground and the source of the PMOS FET connected to the I/O supply terminal. The CMOS output stage drives the I/O line to the memory chip, possibly through a network of resistors or MOS transistors. In accordance with some embodiments, a second PMOS FET and a second NMOS FET are cascaded with the first PMOS FET and the first NMOS FET. The gate voltages of the second PMOS and NMOS FETs are set to shield the drain voltages of first PMOS FET and the first NMOS FET from the full voltage output swing. In this manner, the first PMOS FET and the first NMOS FET can be implemented with signal devices that are smaller with better performance characteristics.

In operation 730, a voltage translation capacitor 644 is charged to a voltage equal to the difference between the I/O supply voltage and the core supply voltage. This charging process is performed with a switched capacitor 640 and a set of CMOS transmission gate switches. The switched capacitor 640 is first charged to the voltage difference between the I/O supply voltage and the core supply voltage using a first pair of reload transmission gate switches. Then, the reload switches are opened and a pair of Charge switches are closed. Closing the charge switches connects the switched capacitor 640 to the voltage translation capacitor 644 and transfers charge between the capacitors. In this way, any charge that bleeds off the voltage translation capacitor 644 is replenished by the switched capacitor 640. The switches are controlled by a pair of non-overlapping clock signals to ensure that the reload switches are not closed at the same time as the charge switches. In this way, the voltage translation capacitor 644 can continue to operate, translating the core logic voltage level to the I/O drive voltage level, while the charge operation or refresh operation is performed in the background.

In operation 740, the first NMOS ITT is switched on or off using an output of the first CMOS logic gate. This is possible because the threshold voltage of the NMOS FET is less than the core supply voltage. Switching the first NMOS FET on pulls the I/O line to a low voltage.

In operation 750, the first PMOS FET is switched on or off using an output of the second CMOS logic gate. The second CMOS logic gate can perform this function through the level translation capacitor. This allows the second CMOS logic gate to push the gate voltage of the first PMOS FET high enough to turn it off despite its source connection to the I/O supply voltage. The voltage translation capacitor 644 maintains a voltage during this switching process that is sufficient to turn the first PMOS FET on and off Switching the first PMOS FET on pulls the I/O output voltage up. The gate terminal of the first PMOS FET is electrically floating (e.g. there is no DC conductive path to around). The circuit relies on the voltage translation capacitor 644 to control the gate voltage. In this way, the voltage translation capacitor 644 may be referred to as a "flying capacitor." The gate voltage of the PMOS FET is controlled by maintaining the charge on the voltage translation capacitor 644. This involves a periodic refresh of the voltage translation capacitor 644 as described in operation 730 above.

The remaining points to be made about the operation of the high speed voltage translation driver apparatus are with regard to the high impedance mode and the output drive level. Circuit can be set into a high impedance mode by driving the first and second CMOS logic gate outputs in opposite directions. The first CMOS logic gate switches low which turns the first NMOS FET off. The second CMOS logic gate switches high which turns the first PMOS FET off. At this point, the I/O line is floating in a high impedance state which allows the I/O line to be used for receiving data.

Second, a bank of segments of the high speed level translator apparatus can be constructed to control the drive level applied to the I/O line. The segments operate in parallel with each other and can be individually switched on or off. If the drive level needs to be increased, more of the parallel segments can be activated. If the drive level needs to be decreased, some of the parallel segments can be set to high impedance mode so as not to the affect the I/O line. The last mode of operation is called park which places all of the segments of the high speed driver apparatus into a high impedance state. It also connects the voltage translation capacitor 644 from the core supply voltage across to the I/O supply voltage. This way, it can be quickly initialized on power up and is ready for operation anytime the circuit is removed from the park mode for active I/O transmitting.

Figure 8:
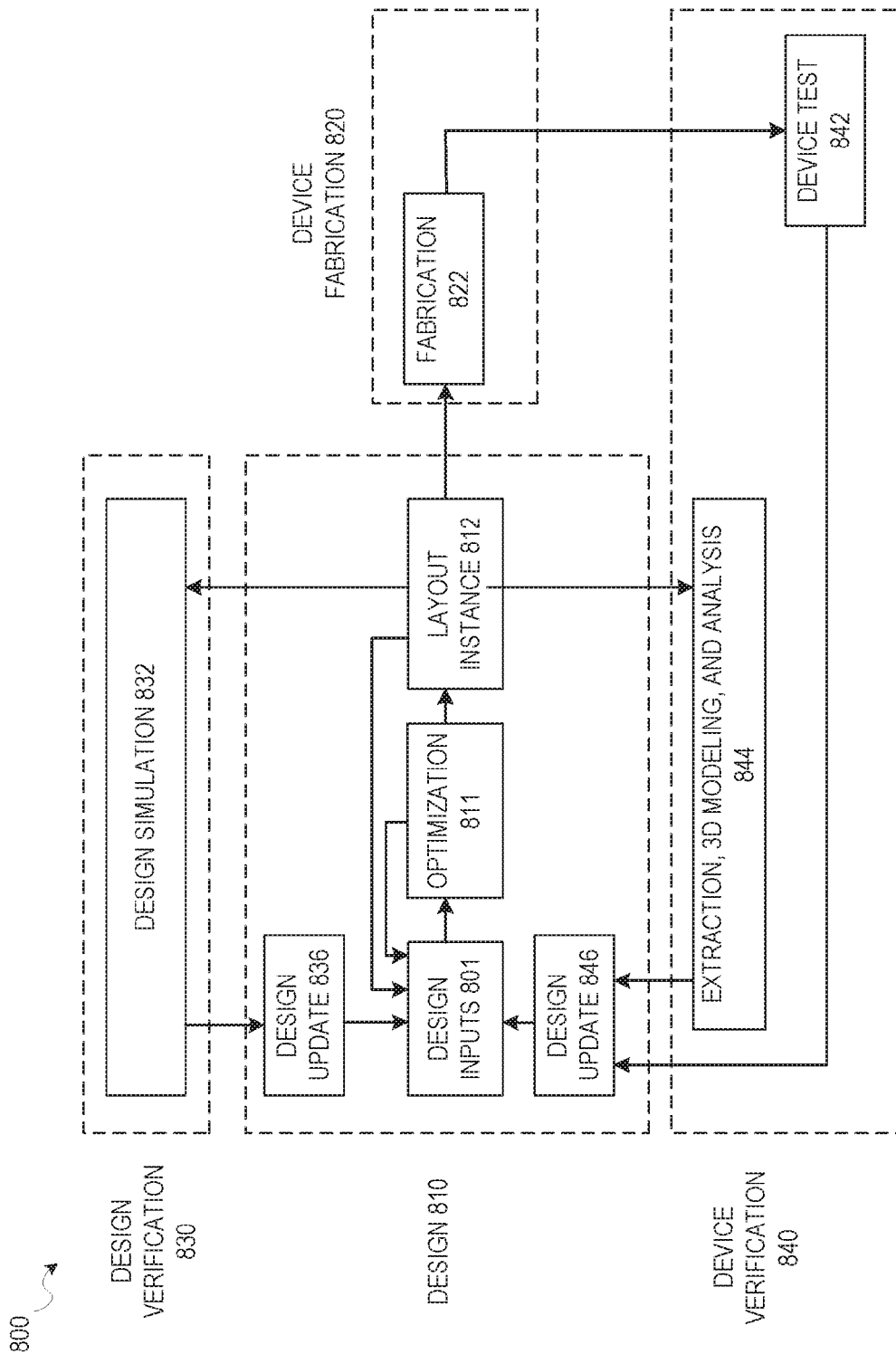
FIG. 8 is a diagram illustrating one possible design process flow for generating a circuit including embodiments to implement I/O driver circuits to interface a microprocessor with memory, in accordance with some embodiments.

FIG. 8 is a diagram illustrating one possible design process flow for generating a circuit including embodiments to implement I/O driver circuits to interface a microprocessor 110 with memory in accordance with sonic embodiments. As illustrated, the overall design flow 800 includes a design phase 810, a device fabrication phase 820, a design verification phase 830, and a device verification phase 840. The design phase 810 involves an initial design input operation 801 where the basic elements and functionality of a device are determined, as well as revisions based on various analyses and optimization of a circuit design. This design input operation 801 is where instances of a design block are used in the design and any additional circuitry is selected. The initial strategy, tactics, and context for the device to be created are also generated in the design input operation 801, depending on the particular design algorithm to be used.

In some embodiments, following an initial selection of design values in design input operation 801, timing analysis and optimization, according to various embodiments, occurs in an optimization operation 811, along with any other automated design processes. One such process may be the automated design of control circuitry to switch a DDR programmable level translator device depending on the type of DDR memory being accessed. As described below, design constraints for blocks of a circuit design generated with design inputs in design input operation 801 may be analyzed using hierarchical timing analysis according to various embodiments. While design flow 800 shows such optimization occurring prior to layout instance 812, such hierarchical timing analysis and optimization may be performed at any time to verify operation of a circuit design. For example, in various embodiments, constraints for blocks in a circuit design may be generated prior to routing of connections in a circuit design, after routing, during register transfer level (RTL) operations, or as part of a final signoff optimization or verification prior to a device fabrication operation 822.

After design inputs are used in design input operation 801 to generate a circuit layout, and any optimization operations 811 are performed, a layout is generated in layout instance 812. The layout describes the physical layout dimensions of the device that match the design inputs. This layout may then be used in a fabrication operation 822 to generate a device, or additional testing and design updates may be performed using designer inputs or automated updates based on the design simulation 832 operations or 3D modeling and analysis 844 operations. Once the device is generated, the device can be tested as part of device test 842 operations, and layout modifications generated based on actual device performance.

As described in more detail below, design updates 836 from design simulation 832, design updates 846 from device test 842 or 3D modeling and analysis 844 operations, or direct design input operation 801 may occur after an initial layout instance 812 is generated. In various embodiments, whenever design inputs are used to update or change an aspect of a circuit design, a timing analysis and optimization operation 811 may be performed.

For example, in various embodiments, a user may provide an input to an EDA computing device indicating placement of an instance of a design block within a first portion of a circuit design. Once a design is ready, another input to the EDA computing device may be used to generate constraints for each instance of the design block, and a timing analysis may be performed using the constraints. An output to a display of the EDA computing device may show results of the timing analysis, or may show optimizations recommended or automatically performed adjustments in the circuit design based on the timing analysis. Further inputs to the EDA computing device may involve adjustments as user design inputs, with additional timing analysis and optimization initiated via user operation of the EDA computing device.

Figure 9:
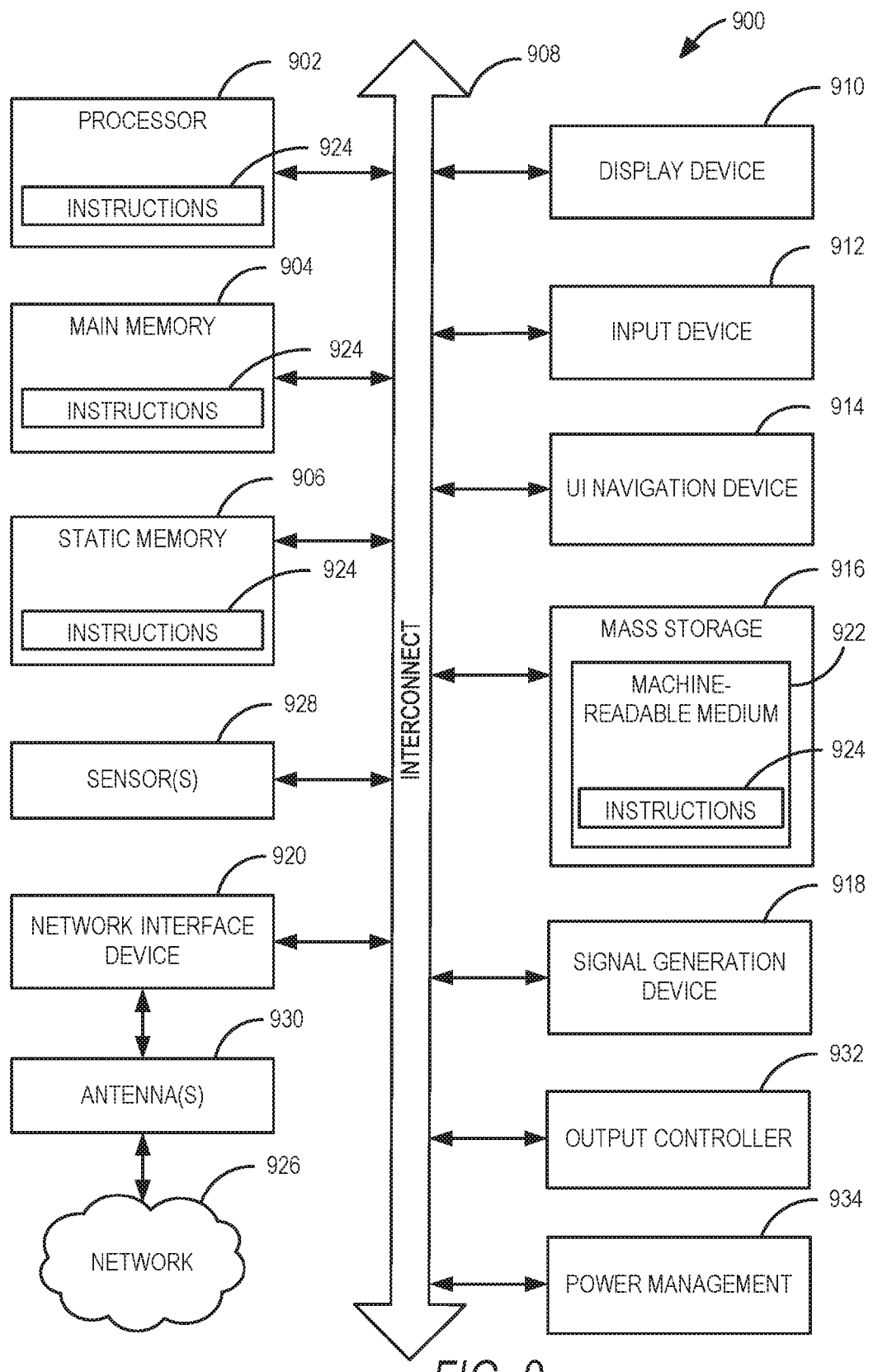
FIG. 9 is a block diagram illustrating an example computer system machine upon which any one or more of the methodologies herein discussed can be run.

FIG. 9 is a block diagram illustrating an example computer system machine 900 upon which any one or more of the methodologies herein discussed can be run. Computer system machine 900 or elements of computer system machine 900 may be used to implement any device, a mobile phone, tablet, laptop wireless access point, wireless station device or any other such device described herein. In various other embodiments, different device components or multiples of any element may be used in different devices. Some embodiments may involve the use of a computer system machine 900 running electronic design automation tools to aid in the design and creation of hardware systems. In various alternative embodiments, the machine 900 operates as a standalone device or can be connected (e.g., networked) to other machines. In a networked deployment, the machine 900 can operate in the capacity of either a server or a client machine in server-client network environments, or it can act as a peer machine in peer-to-peer (or distributed) network environments. The machine 900 can be a personal computer (PC) that may or may not be portable (e.g., a notebook or a netbook), a tablet, a set-top box (STB), a gaming console, a personal digital assistant (PDA), a mobile telephone or smartphone, a web appliance, a network router, switch or bridge, or any machine capable of executing instructions (sequential or otherwise) that specify actions to be taken by that machine, Further, while only a single machine 900 is illustrated, the term "machine" shall also be taken to include any collection of machines that individually or jointly execute a set (or multiple sets) of instructions to perform any one or more of the methodologies discussed herein.

Example computer system machine 900 includes a processor 902 (e.g., a central processing unit (CPU), a graphics processing unit (GPU) or both), a main memory 904 and a static memory 906, which communicate with each other via an interconnect 908 (e.g., a link, a bus, etc.). The computer system machine 900 can further include a display device 910, an alphanumeric input device 912 (e.g., a keyboard), and a user interface (UI) navigation device 914 (e.g., a mouse). In one embodiment, the display device 910, input device 912 and UI navigation device 914 are a touch screen display. The computer system machine 900 can additionally include a storage device 916 (e.g., a drive unit), a signal generation device 918 (e.g., a speaker), an output controller 932, a power management controller 934, and a network interface device 920 (which can include or operably communicate with one or more antennas 930, transceivers, or other wireless communications hardware), and one or more sensors 928, such as a Global Positioning Sensor (GPS) sensor, compass, location sensor, accelerometer, or other sensor.

The storage device 916 includes a machine-readable medium 922 on which is stored one or more sets of data structures and instructions 924 (e.g., software) embodying or utilized by any one or more of the methodologies or functions described herein. The instructions 924 can also reside, completely or at least partially, within the main memory 904, static memory 906, and/or within the processor 902 during execution thereof by the computer system machine 900, with the main memory 904, static memory 906, and the processor 902 also constituting machine-readable media 977.

While the machine-readable medium 922 is illustrated in an example embodiment to be a single medium, the term "machine-readable medium" can include a single medium or multiple media (e.g., a centralized or distributed database, and/or associated caches and servers) that store the one or more instructions 924. The term "machine-readable medium" shall also be taken to include any tangible medium that is capable of storing, encoding or carrying instructions 924 for execution by the machine 900 and that cause the machine 900 to perform any one or more of the methodologies of the present disclosure or that is capable of storing, encoding or carrying data structures utilized by or associated with such instructions 924.

Various techniques, or certain aspects or portions thereof may take the form of program code (i.e., instructions 924) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor 902, a storage medium readable by the processor 902 (including volatile and non-volatile memory and/or storage elements), at least one input device 912, and at least one output device. The volatile and non-volatile memory and/or storage elements may be a random access memory (RAM), erasable programmable read only memory (EPROM), flash drive, optical drive, magnetic hard drive, or other medium for storing electronic data. The base station and mobile station may also include a transceiver module, a counter module, a processing module, and/or a clock module or timer module. One or more programs that may implement or utilize the various techniques described herein may use an application programming interface (API), reusable controls, and the like. Such programs may be implemented in a high level procedural or object oriented programming language to communicate with a computer system However, the program(s) may be implemented in assembly or machine language, if desired. In any case, the language may be a compiled or interpreted language, and combined with hardware implementations.

The embodiments described above can be implemented in one or a combination of hardware, firmware, and software. Various methods or techniques, or certain aspects or portions thereof, can take the form of program code (i.e., instructions 924) embodied in tangible media, such as flash memory, hard drives, portable storage devices, read-only memory (ROM), random-access memory (RAM), semiconductor memory devices (e.g., electrically programmable read-only memory (EPROM), electrically erasable programmable read-only memory (EEPROM)), magnetic disk storage media, optical storage media, and any other machine-readable storage medium 922 or storage device 916 wherein, when the program code is loaded into and executed by a machine 900, such as a computer or networking device, the machine 900 becomes an apparatus for practicing the various techniques.

A machine-readable storage medium 922 or other storage device 916 can include any non-transitory mechanism for storing information in a form readable by a machine 900 (e.g., a computer). In the case of program code executing on programmable computers, the computing device can include a processor 902, a storage medium readable by the processor 902 (including volatile and non-volatile memory and/or storage elements), at least one input device 912, and at least one output device, One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

It should be understood that the functional units or capabilities described in this specification can have been referred to or labeled as components or modules, in order to more particularly emphasize their implementation independence. For example, a component or module can be implemented as a hardware circuit comprising custom very-large-scale integration (VLSI) circuits or gate arrays, off-the-shelf semiconductors such as logic chips, transistors, or other discrete components. A component or module can also be implemented in programmable hardware devices such as field programmable gate arrays, programmable array logic, programmable logic devices, or the like. Components or modules can also be implemented in software for execution by various types of processors. An identified component or module of executable code can, for instance, comprise one or more physical or logical blocks of computer instructions 924, which can, for instance, be organized as an object, procedure, or function. Nevertheless, the executables of an identified component or module need not be physically located together, but can comprise disparate instructions 924 stored in different locations which, when joined logically together, comprise the component or module and achieve the stated purpose for the component or module.

Indeed, a component or module of executable code can be a single instruction, or many instructions 924, and can even be distributed over several different code segments, among different programs, and across several memory devices. Similarly, operational data can be identified and illustrated herein within components or modules, and can be embodied in any suitable form and organized within any suitable type of data structure. The operational data can be collected as a single data set, or can be distributed over different locations including over different storage devices 916, and can exist, at least partially, merely as electronic signals on a system or network. The components or modules can be passive or active, including agents operable to perform desired functions.

We claim that:

1. A high speed level translation memory driver apparatus comprising:
    a first P-type metal oxide semiconductor (PMOS) field effect transistor (FET) wherein a source terminal of the first PMOS FET is connected to an input/output (I/O) voltage supply terminal and a drain terminal of the first PMOS FET is configured to source current to an output of the driver apparatus;
    a first N-type metal oxide semiconductor (NMOS) FET wherein a source terminal of the first NMOS FET is connected to a ground terminal and a drain terminal of the first NMOS FET is configured to sink current from the output of the driver apparatus;
    a first complementary metal oxide semiconductor (CMOS) logic gate configured to drive a gate terminal of the first NMOS FET;
    a second CMOS logic gate configured to drive a gate terminal of the first PMOS FET; and
    a voltage translation capacitor wherein a first terminal of the voltage translation capacitor is connected to an output of the second CMOS logic gate and a second terminal of the voltage translation capacitor is connected to the gate terminal of the first PMOS FET.

2. The apparatus of claim 1, wherein the voltage translation capacitor is configured to maintain a voltage sufficient to switch the first PMOS FET on and off when the second CMOS logic gate is switching.

3. The apparatus of claim 2, wherein the first CMOS logic gate and the second CMOS logic gate are configured to operate from a core supply voltage that is less than an I/O supply voltage.

4. The apparatus of claim 3, wherein the first NMOS FET is configured to switch on and switch off when the first CMOS logic gate is switching.

5. The apparatus of claim 4, further comprising:
    a switched capacitor;
    a first reload switch configured to connect a first terminal of the switched capacitor to a core voltage supply terminal;
    a second reload switch configured to connect a second terminal of the switched capacitor to the I/O voltage supply terminal;
    a first charge switch configured to connect the first terminal of the switched capacitor to the first terminal of the voltage translation capacitor; and
    a second charge switch configured to connect the second terminal of the switched capacitor to the second terminal of the voltage translation capacitor,
    wherein the first reload switch, the second reload switch, the first charge switch and the second charge switch are opening switches.

6. The apparatus of claim 5, further comprising a non-overlapping clock generator configured to alternately close the reload switches and the charge switches such that the reload switches are not closed at the same time as the charge switches.

7. The apparatus of claim 5, wherein the opening switches are implemented with CMOS transmission gates.

8. The apparatus of claim 4, wherein:
    an NMOS threshold voltage of the first NMOS FET is less than the core supply voltage; and
    a magnitude of a PMOS threshold voltage of the first PMOS FET is less than the core supply voltage.

9. The apparatus of claim 4, wherein:
    an output of the first CMOS logic gate and the output of the second CMOS logic gate are configured to switch between a ground voltage and the core supply voltage together when transmitting data from the output of the driver apparatus; and
    the output of the first CMOS logic gate is configured to switch to the ground voltage and the second CMOS logic gate is configured to switch to the core supply voltage when the driver apparatus is not transmitting data.

10. The apparatus of claim 4, wherein the first CMOS logic gate and the second CMOS logic gate are constructed with signal transistors that are not designed to withstand the I/O supply voltage levels.

11. The apparatus of claim 4, further comprising:
    a second PMOS FET wherein:
        a source terminal of the second PMOS FET is connected to a drain terminal of the first PMOS FET; and
        a drain terminal of the second PMOS FET is configured to source current to the output of the driver apparatus; and
    a second NMOS FET wherein:
        a source terminal of the second NMOS FET is connected to a drain terminal of the first NMOS FET; and
        a drain terminal of the second NMOS FET is configured to sink current from the output of the driver apparatus; and
    wherein:
        the first NMOS FET and the first PMOS FET are signal transistors that are not designed to withstand the I/O supply voltage levels; and
        a gate terminal of the second PMOS FET and a gate terminal of the second NMOS FET are configured to operate with a bias voltage so as to prevent the first PMOS FET and the first NMOS FET from being damaged.

12. The apparatus of claim 1, further comprising:
a plurality of driver segments in parallel, each driver segment comprising:
  a corresponding first P-type metal oxide semiconductor (PMOS) field effect transistor (FET) wherein a source terminal of the corresponding first PMOS FET is connected to the input/output (I/O) voltage supply terminal and a drain terminal of the corresponding first PMOS FET is configured to source current to the output of the driver apparatus;
  a corresponding first N-type metal oxide semiconductor (NMOS) FET wherein a source terminal of the corresponding first NMOS FET is connected to the ground terminal and a drain terminal of the corresponding first NMOS FET is configured to sink current from the output of the driver apparatus;
  a corresponding first complementary metal oxide semiconductor (CMOS) logic gate configured to drive a gate terminal of the corresponding first NMOS FET;
  a corresponding second CMOS logic gate configured to drive a gate terminal of the corresponding first PMOS FET;
  a corresponding voltage translation capacitor wherein a first terminal of the corresponding voltage translation capacitor is connected to an output of the corresponding second CMOS logic gate and a second terminal of the corresponding voltage translation capacitor is connected to the gate terminal of the corresponding first PMOS FET; and
  wherein a first driver segment of the plurality of driver segments comprises the first PMOS FET, the first NMOS FET, the first CMOS logic gate, the second CMOS logic gate, and the voltage translation capacitor.

13. The apparatus of claim 1, further comprising microprocessor circuitry configured to execute program code that causes the microprocessor to write data to a double data rate (DDR) memory device.

14. A method for driving a double data rate (DDR) memory device from a microprocessor comprising:
  applying power to a first complementary metal oxide semiconductor (CMOS) logic and a second CMOS logic gate from a core supply voltage;
  applying power to an output stage from an input/output (I/O) supply voltage wherein the output stage comprises a first N-channel metal oxide semiconductor (NMOS) field effect transistor (FET) and a first P-channel metal oxide semiconductor (PMOS) FET;
  charging a voltage translation capacitor to a voltage comparable to a difference between the I/O supply voltage and the core supply voltage;
  driving a gate terminal of the first NMOS FET using an output of the first CMOS logic gate and switching the first NMOS FET on and off;
  driving a gate terminal of the first PMOS FET through the voltage translation capacitor using an output of the second CMOS logic gate and switching the first PMOS FET on and off;
  wherein the first PMOS FET is configured to source current to a driver output terminal of the microprocessor and the first NMOS FET is configured to sink current from the driver output terminal of the microprocessor.

15. The method of claim 14 further comprising switching the first PMOS FET and the first NMOS FET off and switching the driver output into a high impedance state; wherein the I/O supply voltage is greater than the core supply voltage.

16. The method of claim 14, further comprising:
  closing a first reload switch and short circuiting a first terminal of a switched capacitor to the core supply voltage;
  closing a second reload switch and short circuiting a second terminal of the switched capacitor to the I/O supply voltage; and
  charging the switched capacitor to the voltage comparable to the difference between the I/O supply voltage and the core supply voltage;
  opening the first reload switch;
  opening the second reload switch;
  closing a first charge switch and short circuiting a first terminal of the voltage translation capacitor to the core supply voltage;
  closing a second reload switch and short circuiting a second terminal of the voltage translation capacitor to the I/O supply voltage;
  transferring charge between the switched capacitor and the voltage translation capacitor;
  driving data to the driver output and transferring charge between the switched capacitor and the voltage translation capacitor simultaneously; and
  using a non-overlapping clock generator to control the reload switches and the charge switches wherein the reload switches are never closed at the same time as the charge switches.

17. A non-transitory computer readable medium comprising instructions that, when executed by one or more processors of an electronic design automation (EDA) computing device, cause the EDA computing device to generate a circuit design by configuring the EDA computing device to perform operations:
  configuring a first P-type metal oxide semiconductor (PMOS) field effect transistor (FET) with a source terminal of the first PMOS VET connected to an input/output (I/O) voltage supply terminal and a drain terminal of the first PMOS FET configured to source current to an output of a high speed level translation memory driver,
  configuring a first N-type metal oxide semiconductor (NMOS) FET with a source terminal of the first NMOS FET connected to a ground terminal and a drain terminal of the first NMOS FET configured to sink current from the output of the high speed level translation memory driver;
  configuring a first complementary metal oxide semiconductor (CMOS) logic gate to drive a gate terminal of the first NMOS FET;
  configuring a second CMOS logic gate to drive a gate terminal of the first PMOS FET; and
  configuring a voltage translation capacitor with a first terminal of the voltage translation capacitor connected to an output of the second CMOS logic gate and a second terminal of the voltage translation capacitor is connected to the gate terminal of the first PMOS FET; and
  generating a circuit design file associated with the circuit design.

18. The non-transitory computer readable medium of claim 17, further comprising instructions that cause the EDA computing device to configure the voltage translation capacitor to maintain a voltage sufficient to switch the first PMOS FET on and off when the second CMOS logic gate is switching.

19. The non-transitory computer readable medium of claim 17, further comprising instructions that cause the EDA computing device to configure the first CMOS logic gate and the second CMOS logic gate to operate from a core voltage supply.

20. The non-transitory computer readable medium of claim 17, further comprising instructions that cause the EDA computing device to:
- configure switched capacitor to transfer charge to the voltage translation capacitor;
- configure a first reload switch to short a first terminal of the switched capacitor to a core voltage supply terminal when the first reload switch is closed;
- configure a second reload switch to short a second terminal of the switched capacitor to the I/O voltage supply terminal when the second reload switch is closed;
- configure a first charge switch to short the first terminal of the switched capacitor to the first terminal of the voltage translation capacitor when the first charge switch is closed;
- configure a second charge switch to short the second terminal of the switched capacitor to the second terminal of the voltage translation capacitor; and
- configure a non-overlapping clock generator to alternately close the reload switches and the charge switches wherein the reload switches are not closed at the same time as the charge switches.

\* \* \* \* \*